(12) United States Patent
Sasaki

(10) Patent No.: US 10,957,770 B2
(45) Date of Patent: Mar. 23, 2021

(54) METHOD FOR MANUFACTURING COMPOUND SEMICONDUCTOR DEVICE

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 163 days.

(21) Appl. No.: 16/304,770

(22) PCT Filed: Dec. 22, 2016

(86) PCT No.: PCT/JP2016/088493
§ 371 (c)(1),
(2) Date: Nov. 27, 2018

(87) PCT Pub. No.: WO2018/078892
PCT Pub. Date: May 3, 2018

(65) Prior Publication Data
US 2020/0295144 A1 Sep. 17, 2020

(30) Foreign Application Priority Data
Oct. 24, 2016 (JP) ................. 2016-208085

(51) Int. Cl.
*H01L 29/40* (2006.01)
*H01L 29/778* (2006.01)
(Continued)

(52) U.S. Cl.
CPC ...... *H01L 29/402* (2013.01); *H01L 29/66462* (2013.01); *H01L 29/7786* (2013.01); *H01L 29/2003* (2013.01)

(58) Field of Classification Search
CPC ..... H01L 29/402–407; H01L 29/66462; H01L 29/7786–7787
See application file for complete search history.

(56) References Cited

U.S. PATENT DOCUMENTS

2002/0140007 A1   10/2002   Sakamoto
2006/0175670 A1    8/2006   Tsubaki
(Continued)

FOREIGN PATENT DOCUMENTS

JP   2002-299443 A   10/2002
JP   2006-253654 A    9/2006
(Continued)

OTHER PUBLICATIONS

International Search Report issued in PCT/JP2016/088493; dated Mar. 7, 2017.
(Continued)

*Primary Examiner* — Daniel P Shook
(74) *Attorney, Agent, or Firm* — Studebaker & Brackett PC

(57) ABSTRACT

A semiconductor layer (2,3) is provided on a substrate (1). A gate electrode (4), a source electrode (5) and a drain electrode (6) are provided on the semiconductor layer (3). A first passivation film (7) covers the gate electrode (4) and the semiconductor layer (3). A source field plate (9) is provided on the first passivation film (7), and extends from the source electrode (5) to a space between the gate electrode (4) and the drain electrode (6). A second passivation film (10) covers the first passivation film (7) and the source field plate (9). An end portion on the drain electrode (6) side of the source field plate (9) is curved to be rounded.

1 Claim, 5 Drawing Sheets

(51) Int. Cl.
    *H01L 29/66*         (2006.01)
    *H01L 29/20*         (2006.01)

(56) References Cited

U.S. PATENT DOCUMENTS

| | | |
|---|---|---|
| 2009/0230430 A1 | 9/2009 | Miyamoto et al. |
| 2010/0059798 A1 | 3/2010 | Kawasaki |
| 2013/0341640 A1* | 12/2013 | Sakurai ................ H01L 29/401 |
| | | 257/77 |
| 2014/0231823 A1* | 8/2014 | Chowdhury .......... H01L 29/205 |
| | | 257/76 |
| 2016/0268410 A1 | 9/2016 | Onizawa et al. |

FOREIGN PATENT DOCUMENTS

| | | |
|---|---|---|
| JP | 2008-243943 A | 10/2008 |
| JP | 2010-067693 A | 3/2010 |
| JP | 2015-170821 A | 9/2015 |
| JP | 2015-192060 A | 11/2015 |
| JP | 2016-058721 A | 4/2016 |
| JP | 2016-171197 A | 9/2016 |
| WO | 2006132419 A1 | 12/2006 |

OTHER PUBLICATIONS

Written Opinion issued in PCT/JP2016/088493; dated Mar. 7, 2017.
Notification of Transmittal of the International Search Report and the Written Opinion of the International Searching Authority, or the Declaration issued in PCT/JP2016/088493; dated Mar. 7, 2017.
An Office Action; "Notification of Reasons for Refusal," issued by the Japanese Patent Office dated Jun. 13, 2017, which corresponds to Japanese Patent Application No. 2017-522679.

\* cited by examiner

METHOD FOR MANUFACTURING COMPOUND SEMICONDUCTOR DEVICE

FIELD

The present invention relates to a compound semiconductor device that is hard to be broken and deteriorated even under a severe environment under which the compound semiconductor device is exposed to high energy particles, and a manufacturing method capable of easily manufacturing such a device.

BACKGROUND

A compound semiconductor device is used as a field effect transistor such as a MES-FET or a HEMT (for example, see PTL 1 to PTL 4). There is a ease where a device is exposed to a severe environment under which high energy particles are incident to the device, pass through a passivation film, a source field plate, and an active region of the device and reach a substrate. At this time, a large amount of electron-hole pairs are generated around a trajectory through which the high-energy particles have passed, and diffused or recombined according to the mobility of material, a recombination speed, and an applied voltage.

CITATION LIST

Patent Literature

[PTL 1] JP 2006-253654 A
[PTL 2] JP 2008-243943 A
[PTL 3] JP 2010-67693 A
[PTL 4] JP 2015-170821 A

SUMMARY

Technical Problem

A high electric field is applied between an end portion on a drain electrode side of a source field plate and an AlGaN channel layer. Therefore, when a large amount of electron-hole pairs are generated in the passivation film upon incidence of high-energy particles, a conduction path is formed at that portion, resulting in breakage. Or, there has been a problem that the concentration of holes in the vicinity of the surface of a semiconductor increases in the process of diffusion and recombination of electron-hole pairs generated in the semiconductor, which causes an increase in potential or an increase in hole current, resulting the semiconductor device becoming prone to breakage or deterioration. Likewise, there has been a problem that a high electric field is applied between an end portion on a drain electrode side of a gate electrode and the AlGaN channel layer, which makes the semiconductor device prone to breakage or deterioration.

Therefore, it has been performed that the end portion of the source field plate is bent upward at a certain angle to relax the electric field, thereby preventing breakage of the device (for example, see FIG. 6 and paragraph 0043 of PTL 1, and FIG. 1B and paragraph 0015 of PTL 3). However, an electric field relaxation effect is also limited because a bent portion exists. Furthermore, the conventional method have had a problem that a complicated step is required to be added to bend the source field plate, manufacturing is difficult, and the number of manufacturing steps increases, thereby increasing the cost and manufacturing time.

The present invention has been made to solve the problems as described above, and has an object to obtain a compound semiconductor device that is hard to he broken and deteriorated even under a severe environment under which the compound semiconductor device is exposed to high energy particles, and a manufacturing method capable of easily manufacturing such a device.

Solution to Problem

A compound semiconductor device according to the present invention includes: a substrate; a semiconductor layer provided on the substrate; a gate electrode, a source electrode and a drain electrode provided on the semiconductor layer; a first passivation film covering the gate electrode and the semiconductor layer; a source field plate provided on the first passivation film, and extending from the source electrode to a space between the gate electrode and the drain electrode; and a second passivation film covering the first passivation film and the source field plate, wherein an end portion on the drain electrode side of the source field plate is curved to be rounded.

Advantageous Effects of Invention

In the present invention, the end portion on the drain electrode side of the source field plate is curved to be rounded. Accordingly, there is no protruding portion and also it is possible to sufficiently perform the electric field relaxation, so that the device is hard to be broken and deteriorated even under a severe environment exposed to high energy particles.

DESCRIPTION OF EMBODIMENTS

Figure 1:
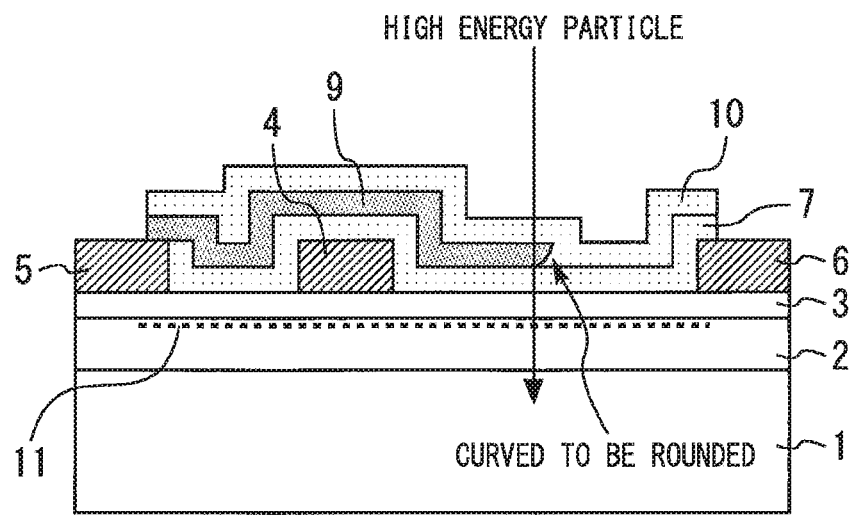
FIG. 1 is a cross-sectional view showing a compound semiconductor device according to an embodiment of the present invention.

FIG. 1 is a cross-sectional view showing a compound semiconductor device according to an embodiment of the present invention. A GaN buffer layer 2 is formed on an SiC substrate 1. An AlGaN channel layer 3 is formed on the GaN buffer layer 2. A gate electrode 4, a source electrode 5, and a drain electrode 6 are formed on the AlGaN channel layer 3.

A first passivation film 7 covers the gate electrode 4 and the AlGaN channel layer 3. A source field plate 9 is formed on the first passivation film 7, and extends from the source electrode 5 to a space between the gate electrode 4 and the drain electrode 6. The source field plate 9 relaxes the electric field between the gate electrode 4 and the drain electrode 6, enables a high voltage operation, and further reduces a parasitic capacitance, thereby improving high frequency characteristics. In order to protect the entire device, a second passivation film 10 covers the first passivation film 7 and the source field plate 9.

When a voltage is applied between the source electrode 5 and the drain electrode 6, and a high frequency is input to the gate electrode 4 while a desired bias voltage is applied to the gate electrode 4, electrons in two-dimensional electron gas 11 move at a high speed, whereby the compound semiconductor device operates as an amplifier capable of obtaining amplified high frequency power from the drain electrode 6.

Figure 2:
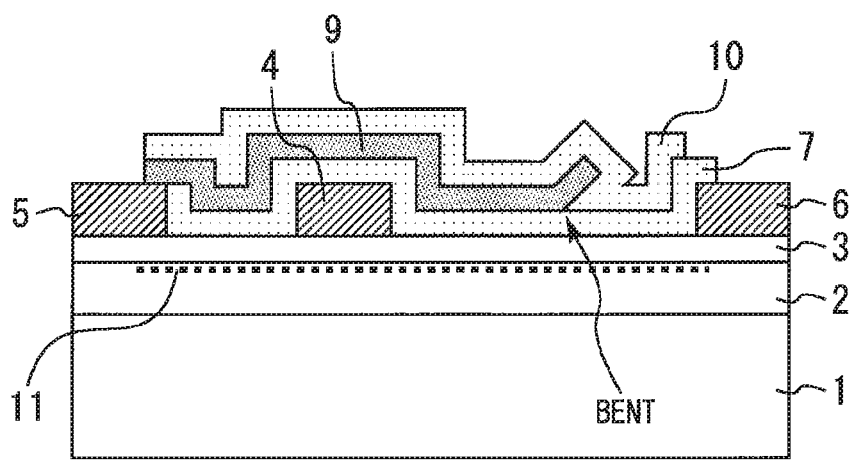
FIG. 2 is a cross-sectional view showing a compound semiconductor device according to a comparative example.

Subsequently, the effect of the compound semiconductor device according to the present embodiment will be described in comparison with a comparative example. FIG. 2 is a cross-sectional view showing a compound semiconductor device according to a comparative example. There is a case where upon incidence of high-energy particles to the device, the high-energy particles pass through the second passivation film 10, the source field plate 9, the first passivation film 7, the AlGaN channel layer 3, and the GaN buffer layer 2 and reaches the SiC substrate 1. Incoming particles are heavy particles, protons, electrons, neutrons, muons, etc. and have energy of about 1 keV to 100 GeV. A large amount of electron-hole pairs are generated around a trajectory through which the high-energy particles have passed.

Normally, the electric field concentrates on a portion having a sharp angle. In the prior art, the end portion of the source field plate has a right angle, so that the electric field concentrates on the end portion. In the comparative example, in order to suppress this concentration of the electric field, the end portion of the source field plate 9 is bent upward at a certain angle. However, the electric field relaxation effect is also limited because a bent portion exists.

On the other hand, in the present embodiment, the end portion on the drain electrode side 6 of the source field plate 9 is curved to be rounded in an inversely tapered shape. Accordingly, there is no protruding portion and also it is possible to sufficiently perform the electric field relaxation, so that the device is hard to be broken and deteriorated even under a severe environment exposed to high energy particles. Although an upper side of the end portion of the source field plate 9 may be curved, the effect is limited because it is far from the semiconductor. Accordingly, it is preferable that the end portion of the source field plate 9 is inversely tapered.

Figure 3:
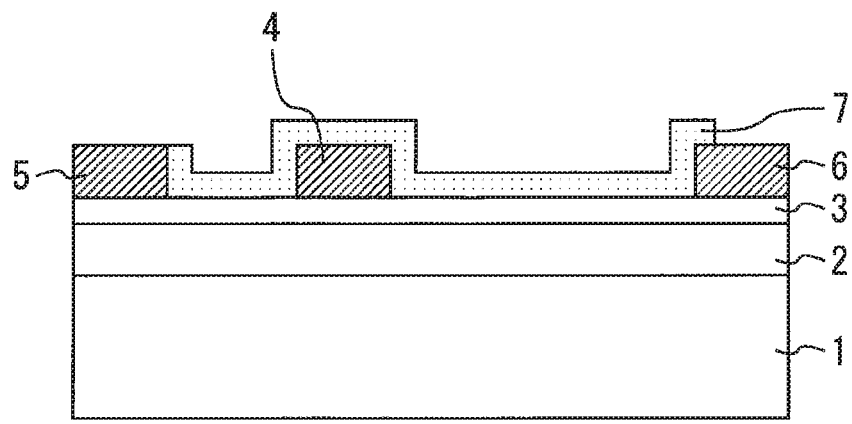
FIG. 3 is a cross-sectional view showing a manufacturing process of the compound semiconductor device according to the embodiment of the present invention.

FIGS. 3 to 6 are cross-sectional views showing a manufacturing process of the compound semiconductor device according to the embodiment of the present invention. First, as shown in FIG. 3, the GaN buffer layer 2 and the AlGaN channel layer 3 are successively formed on the SiC substrate 1. The gate electrode 4, the source electrode 5 and the drain electrode 6 are formed on the AlGaN channel layer 3. The first passivation film 7 covering the gate electrode 4 and the AlGaN channel layer 3 is formed.

Figure 4:
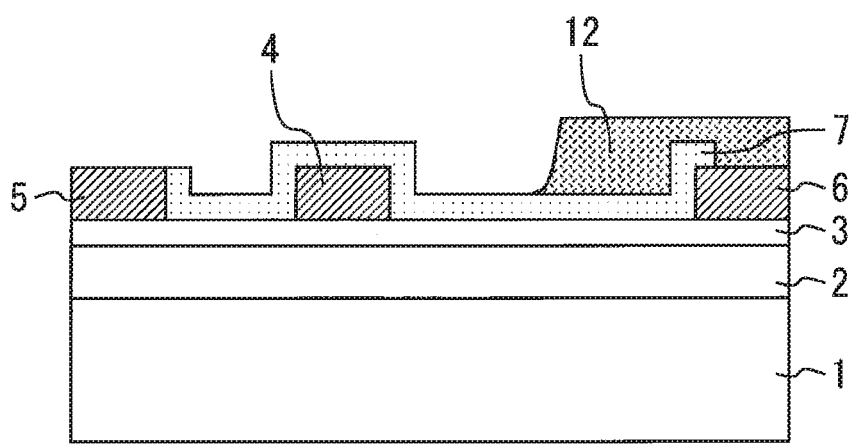
FIG. 4 is a cross-sectional view showing a manufacturing process of the compound semiconductor device according to the embodiment of the present invention.
Figure 5:
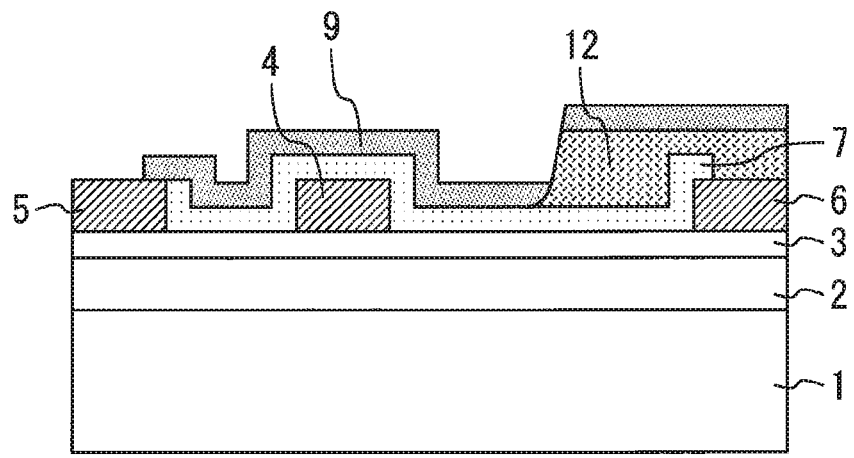
FIG. 5 is a cross-sectional view showing a manufacturing process of the compound semiconductor device according to the embodiment of the present invention.

Next, as shown in FIG. 4, a resist 12 extending from the drain electrode 6 to a space between the gate electrode 4 and the drain electrode 6 is formed on the first passivation film 7. Next, as shown in FIG. 5, the source field plate 9 is formed on the first passivation film 7 and the resist 12.

Figure 6:
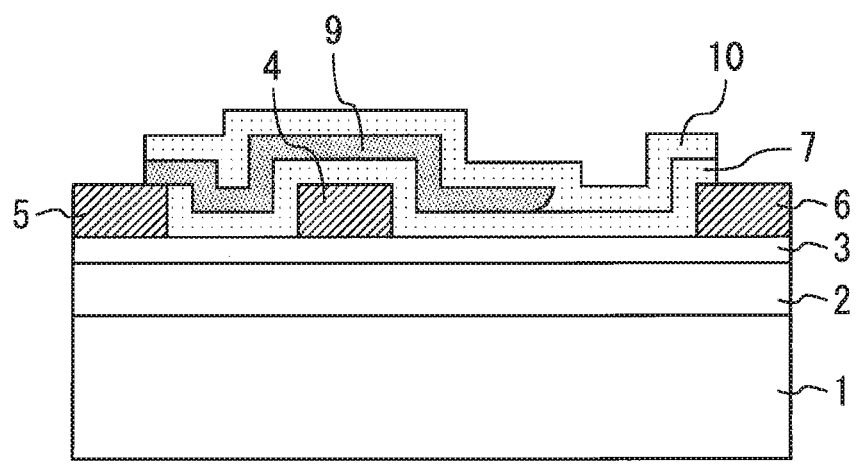
FIG. 6 is a cross-sectional view showing a manufacturing process of the compound semiconductor device according to the embodiment of the present invention.

Next, as shown in FIG. 6, a lift-off step for removing the resist 12 and the source field plate 9 on the resist 12 is performed. Since the resist 12 is thickly formed, stepping occurs, and an unnecessary portion is also removed by removing the resist 12. Thereafter, the second passivation film 10 covering the first passivation film 7 and the source field plate 9 is formed.

Here, the resist 12 is, for example, a model number BL-300 of PIMEL (registered trademark) manufactured by Asahi Kasei E-Materials Co., Ltd. When the resist 12 is formed, a heat treatment is performed at 350° C. for 2 hours to shrink the resist 12, so that the side surface of the resist 12 is thermally drooped in a concave shape. When the source field plate 9 is formed in this state, the end portion on the drain electrode 6 side of the source field plate 9 is curved to be rounded in an inversely tapered shape.

Figure 7:
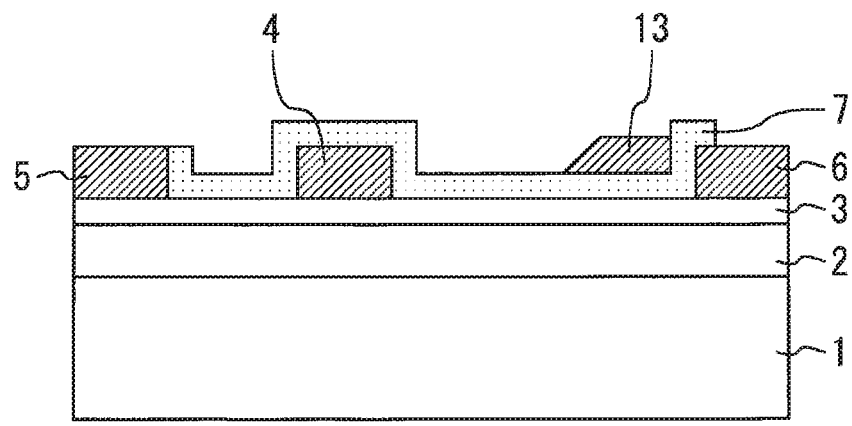
FIG. 7 is a cross-sectional view showing a manufacturing process of a compound semiconductor device according to a comparative example.
Figure 8:
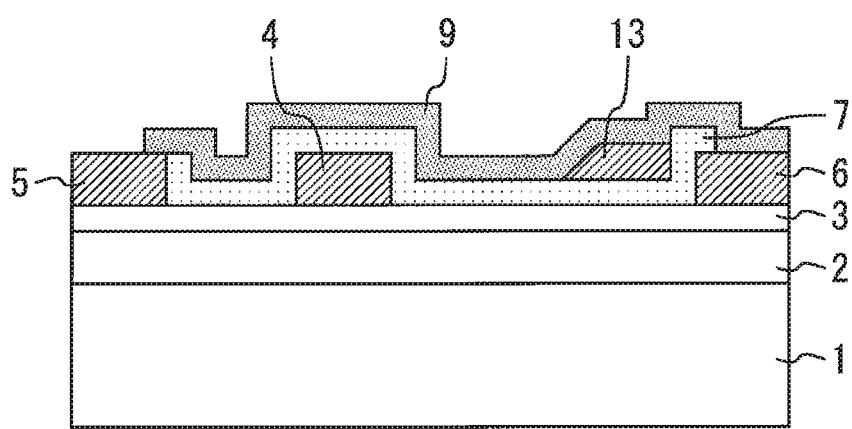
FIG. 8 is a cross-sectional view showing a manufacturing process of a compound semiconductor device according to a comparative example.
Figure 9:
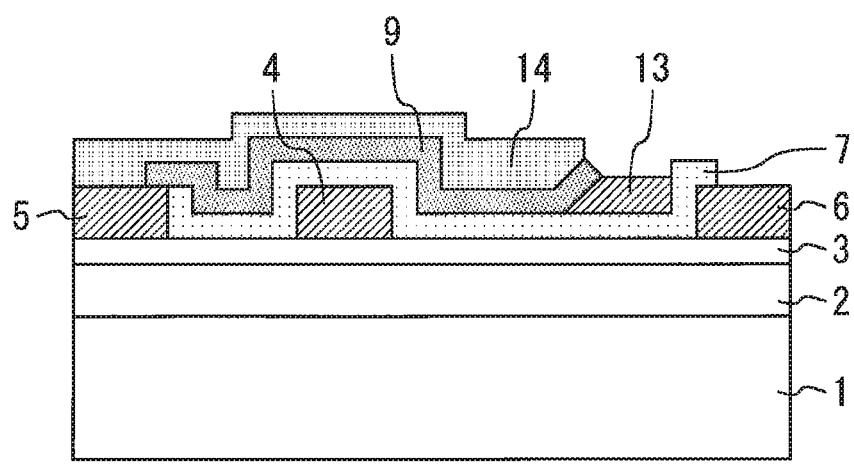
FIG. 9 is a cross-sectional view showing a manufacturing process of a compound semiconductor device according to a comparative example.

Subsequently, the effect of the manufacturing method according to the present embodiment will be described in comparison with a comparative example. FIGS. 7 to 9 are cross-sectional views showing a manufacturing process of a compound semiconductor device according to a comparative example. After performing the step of FIG. 3, a spacer film 13 having a slope shape is formed on the first passivation film 7 as shown in FIG. 7. This slope shape is formed by isotropically etching or the like with dry etching after the resist is formed. Next, as shown in FIG. 8, the source field plate 9 is formed on the first passivation film 7 and the spacer film 13. Next, as shown in FIG. 9, the source field plate 9 is partially covered with the resist 14, and an unnecessary portion of the source field plate 9 is removed by etching using the resist 14 as a mask. Thereafter, the spacer film 13 and the resist 14 are removed, and the second passivation film 10 is formed as shown in FIG. 2.

In the present embodiment, the end portion of the source field plate 9 can be directly curved, so that the number of steps can be reduced by one as compared with the comparative example. Therefore, the manufacturing cost and the manufacturing period can be reduced. Furthermore, the curving work can be performed easily.

REFERENCE SIGNS LIST

1 SiC substrate; 2 GaN buffer layer; 3 AlGaN channel layer; 4 gate electrode; 5 source electrode; 6 drain electrode; 7 first passivation film; 9 source field plate; 10 second passivation film; 12 resist

The invention claimed is:

1. A method for manufacturing a compound semiconductor device comprising:
   forming a semiconductor layer on a substrate;
   forming a gate electrode, a source electrode and a drain electrode on the semiconductor layer;
   forming a first passivation film covering the gate electrode and the semiconductor layer;
   forming a resist extending from the drain electrode to a space between the gate electrode and the drain electrode on the first passivation film;
   forming a conductive film on the first passivation film and the resist;
   removing the resist and the conductive film on the resist to form a source field plate; and
   forming a second passivation film covering the first passivation film and the source field plate, wherein when the resist is formed, a heat treatment is performed to shrink the resist so that a side surface of the resist is thermally drooped in a concave shape.

\* \* \* \* \*